United States Patent
Nojiri et al.

(10) Patent No.: US 6,856,022 B2
(45) Date of Patent: Feb. 15, 2005

(54) SEMICONDUCTOR DEVICE

(75) Inventors: Naoki Nojiri, Osaka (JP); Koji Takemura, Osaka (JP); Noriyuki Nagai, Nara (JP); Atsushi Doi, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/402,240

(22) Filed: Mar. 31, 2003

(65) Prior Publication Data

US 2004/0188848 A1 Sep. 30, 2004

(51) Int. Cl.[7] .................. H01L 23/48; H01L 23/52; H01L 29/40
(52) U.S. Cl. .................. 257/773; 257/784; 257/788
(58) Field of Search .................. 257/773, 774, 257/775, 779, 780, 784, 788

(56) References Cited

U.S. PATENT DOCUMENTS 4,992,845 A * 2/1991 Arakawa et al. ............ 257/203
4,999,698 A * 3/1991 Okuno et al. ............... 257/206

FOREIGN PATENT DOCUMENTS

| JP | 61-290747 | 12/1986 |
| JP | 07-37929 | 2/1995 |
| JP | P2000-164620 A | 6/2000 |
| JP | P2002-329742 A | 11/2002 |

* cited by examiner

Primary Examiner—Phuc T. Dang
(74) Attorney, Agent, or Firm—McDermott Will & Emery LLP

(57) ABSTRACT

According to the invention, in input/output circuit portions positioned around a semiconductor chip, electrode pads are arranged above each of a plurality of input/output cells arranged in a line. The width of the electrode pads is greater than the width of the input/output cells, and thus the electrode pads cannot be arranged in a single line and are instead arranged staggered in two lines. The electrode pads of one row are arranged shifted so that they do not overlap with the internal terminals of the input/output cells, but are disposed near these internal terminals. The spacing between the electrode pads is set to a distance that is at least a set distance determined by the isolation rules of the design.

12 Claims, 10 Drawing Sheets

SEMICONDUCTOR DEVICE

BACKGROUND OF THE INVENTION

The present invention relates to semiconductor devices, and in particular relates to improving input/output circuit portions having output transistors for transmitting the output of an internal circuit to the outside.

In general, with semiconductor integrated circuits, input/output circuit portions for performing input and output between inside and outside circuits are arranged around semiconductor chips, and these input/output circuit portions have a plurality of electrode pads. A conventional configuration of an input/output circuit portion is explained below.

FIG. 2 is a circuit diagram of an input/output circuit portion. In FIG. 2, P1 denotes p-type MOS transistors whose sources are connected to a power line VDD. N1 denotes n-type MOS transistors whose sources are connected to a ground line VSS. The drains of the MOS transistors P1 and N1 are connected to one another, and those points of connection are connected to an electrode pad Pad. Each series circuit made of a p-type MOS transistor P1 and an n-type MOS transistor N1 constitutes an output transistor OT, and a plurality of groups (in FIG. 2, two groups) of output transistors OT are connected in parallel, forming an input/output cell IOC. The output transistors OT also serve as ESD (electro-static discharge) protection transistors of identical configurations.

FIG. 6 shows an example of an in-line configuration in which a plurality of input/output cells IOC, which are provided with the output transistors OT, are lined up in a single row and rectangular electrode pads Pad are disposed to the side of the input/output cells IOC. Each input/output IOC is connected to its own electrode pad Pad by wiring 60. The electrode pads Pad have substantially the same width as the width of the corresponding input/output cells IOC.

FIG. 7 shows another conventional input/output circuit portion. In FIG. 7, each rectangular electrode pad Pad is arranged above its input/output cell IOC. The electrode pads Pad are arranged more on the side opposite the internal circuit side (the right side in FIG. 7) of the input/output cells IOC than on its internal circuit side. Compared to the input/output circuit portion of FIG. 6, the input/output portion of FIG. 7 can be provided with a smaller area because the electrode pads Pad are not arranged to the side of the input/output cells IOC, thereby obviating the need for regions in which to dispose the electrode pads Pad and the wiring 60 for connecting the electrode pads Pad to the input/output circuit portions.

FIG. 8 shows the configuration of yet another conventional input/output circuit portion. With the input/output circuit portion of FIG. 8, the input/output cells IOC have been set to a narrow width in order to reduce the pitch. However, the fact that the wiring for connecting to the outside is bonded to the electrode pads Pad requires the width of the electrode pads Pad to be set wide enough that this bonding can be carried out favorably, and thus the width of the electrode pads Pad is wider than the width of the input/output cells IOC. Consequently, the electrode pads Pad cannot be arranged in a straight line like in FIG. 6, and are arranged in an overall staggered fashion, with the electrode pads Pad arranged alternately shifted to the left and right of one another.

SUMMARY OF THE INVENTION

In recent years there has been a strong demand for compact devices in which semiconductor integrated circuits are mounted, such as portable telephone devices. Accordingly, it is essential that semiconductor integrated circuits are themselves made compact. In particular, with input/output circuit portions, there is a need to provide numerous pins (that is, to provide numerous electrode pads) and at the same time achieve smaller sizes.

It is an object of the present invention, in an input/output circuit portion arranged around the outside of a semiconductor chip, to suitably set the layout of the plurality of electrode pads arranged staggered as mentioned above, so as to favorably secure the functions of the input/output circuit portion while effectively reducing the area of the input/output circuit portion, even if the width of each of the plurality of input/output cells is reduced in order to reduce the pitch and numerous pins are provided.

More specifically, a semiconductor device of the invention includes a plurality of cells having output transistors formed on a substrate, and the plurality of cells are arranged in a line, wherein the plurality of cells have electrode pads for outputting an output of their respective output transistors to the outside, and the electrode pads of the plurality of cells are positioned above their respective cells and arranged in a staggered fashion distanced from the electrode pads of adjacent cells by at least a set distance.

In the semiconductor device of the invention, the cells have internal terminals for transmitting signals of the output transistors to the outside in an end portion in their length direction, and the electrode pads are disposed in locations where they do not overlap with the internal terminals of their respective cells.

In the semiconductor device of the invention, of the electrode pads of the plurality of cells, every other electrode pad is lined up disposed near the internal terminals of its respective cell.

In the semiconductor device of the invention, the plurality of cells are arranged without gaps between them and adjacent cells.

In the semiconductor device of the invention, the electrode pads have a rectangular shape.

In the semiconductor device of the invention, the electrode pads have at least first and second pad portions with different widths, and are formed in a step-like fashion.

In the semiconductor device of the invention, the electrode pads include a first pad portion having a wide width to which wiring for connecting to the outside for outputting an output of the output transistors to the outside is bonded, and a second pad portion with a narrow width that serves as a test portion to which probe pins for testing come into contact with.

In the semiconductor device of the invention, the electrode pads are wider than their respective cells and extend in the width direction toward the inside of cells adjacent their respective cells.

In the semiconductor device of the invention, power source wiring or ground wiring supplying power source voltage or ground voltage to the output transistors is arranged below the electrode pads.

As set forth above, with the invention, electrode pads of the plurality of cells are positioned above their cell, so that the required area can be effectively reduced compared to conventional configurations in which electrode pads are arranged to the side of their respective cells. Moreover, the plurality of electrode pads are arranged in a staggered fashion and the distance between them is at least a set distance, so that the distance rule of the design for the distance between electrode pads can be followed even if the width of each of the cells is narrowed in order to reduce the pitch.

Also, the electrode pads do not overlap with the internal terminals of their cells and are arranged away from these internal terminals, and thus there is no electrical hindrance when the electrode pads are arranged above the cells. Moreover, every other electrode pad in the line is arranged close to one another at a short distance the internal terminals of its cell, and thus also the spacing between the plurality of electrode terminals and the each of plurality of electrode pads arranged at a set distance from those electrode pads is short, bringing the electrode pads closer to the internal terminals of their respective cells and effectively utilizing the area above each cell, allowing a further reduction in area.

DETAILED DESCRIPTION OF THE INVENTION

Hereinafter, embodiments of the semiconductor device according to the invention are described with reference to the drawings.

First Embodiment

Figure 1A:
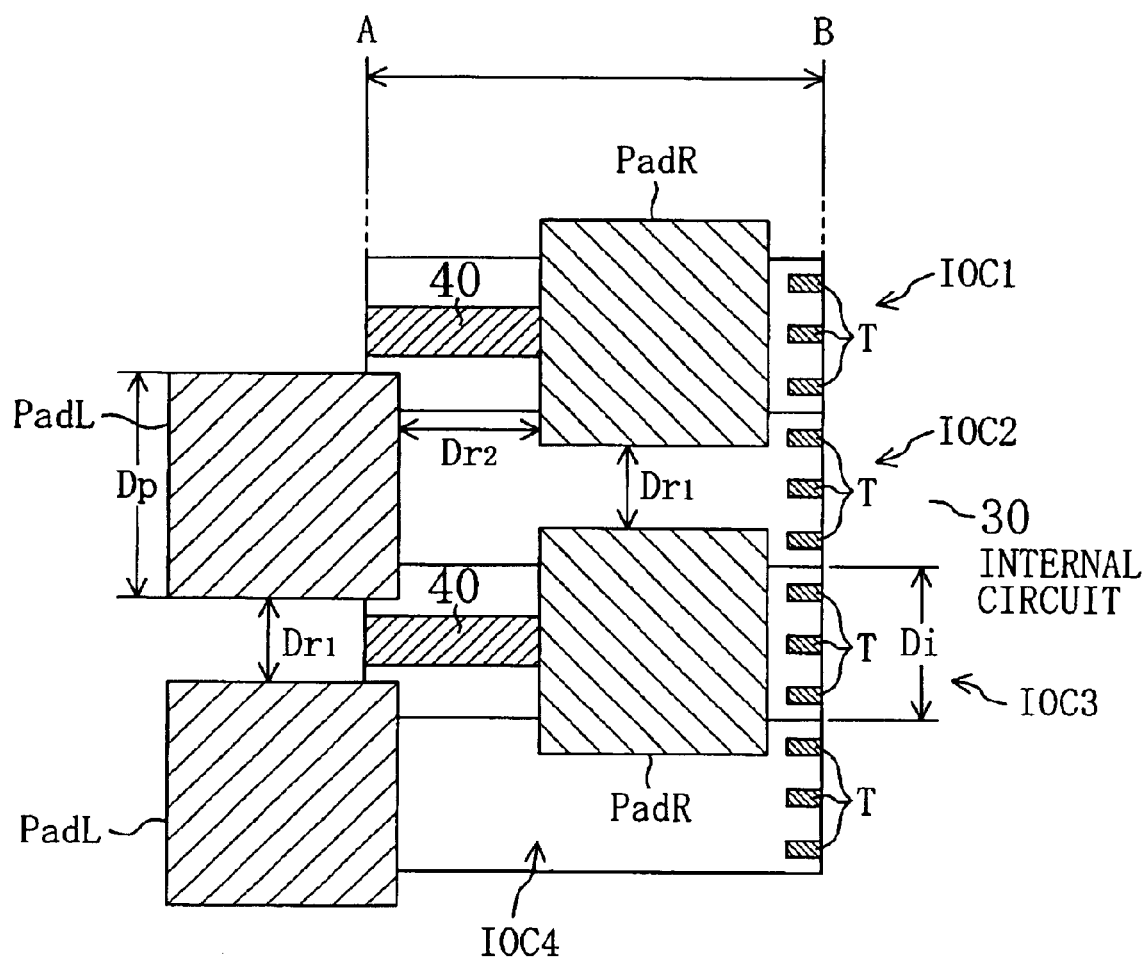
FIG. 1A is a plan view showing a portion of an input/output circuit portion, which is a semiconductor device, according to the first embodiment of the invention.

FIG. 1A shows a specific configuration of the semiconductor device according the first embodiment of the invention.

FIG. 1A shows the major components of an input/output circuit portion disposed at the outer periphery of a semiconductor chip, and a plurality of input/output cells (in FIG. 4, only four are shown) IOC 1 to IOC 4 are arranged in a line. An internal circuit 30, which is constituted by a logic circuit or the like and located toward the inside of the semiconductor chip, is positioned on the side of the plurality of input/output cells IOC (in FIG. 1A, the right side). It should be noted that A and B in the drawings show the end portions of the input/output cells in the length direction.

Figure 2:
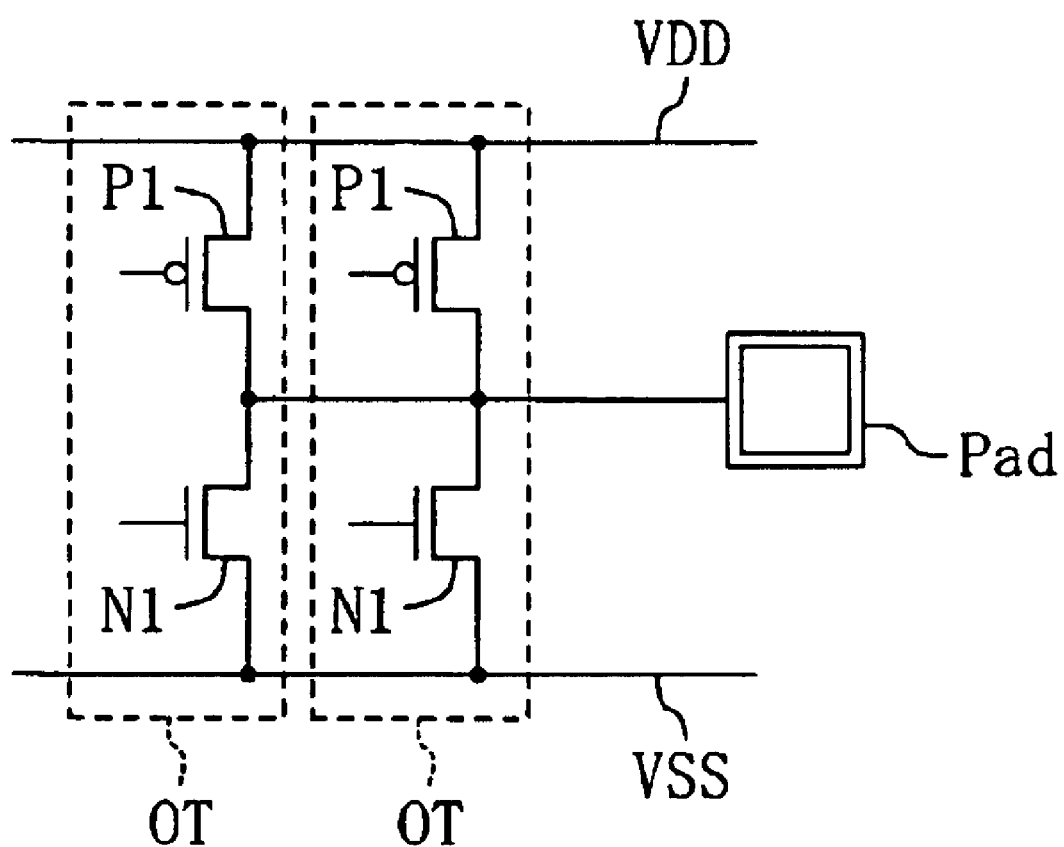
FIG. 2 is a diagram showing the circuit configuration of that input/output circuit portion.

As shown in FIG. 2, the input/output cells IOC 1 to IOC 4 are each provided with a plurality of output transistors OT, which are formed by arranging series circuits of p-type MOS transistors P1 and n-type MOS transistors N1 between a power source line VDD and a ground line VSS. In each output transistor OT, the drains of the p-type MOS transistors P1 and the drains of the n-type MOS transistors N1 are collectively connected to a single electrode pad Pad. The output transistors OT also serve as ESD protection transistors by allowing the high voltage of positive or negative electrostatic discharges that infiltrate from the electrode pads Pad to escape to the power source line VDD or the ground line VSS after passing through the p-type MOS transistors P1 or the n-type MOS transistors N1, thereby protecting the internal circuit 30 from electrostatic discharge. Hereinafter, these transistors acting as both output transistors and ESD protection transistors are referred to as output transistors OT.

Figure 3A:
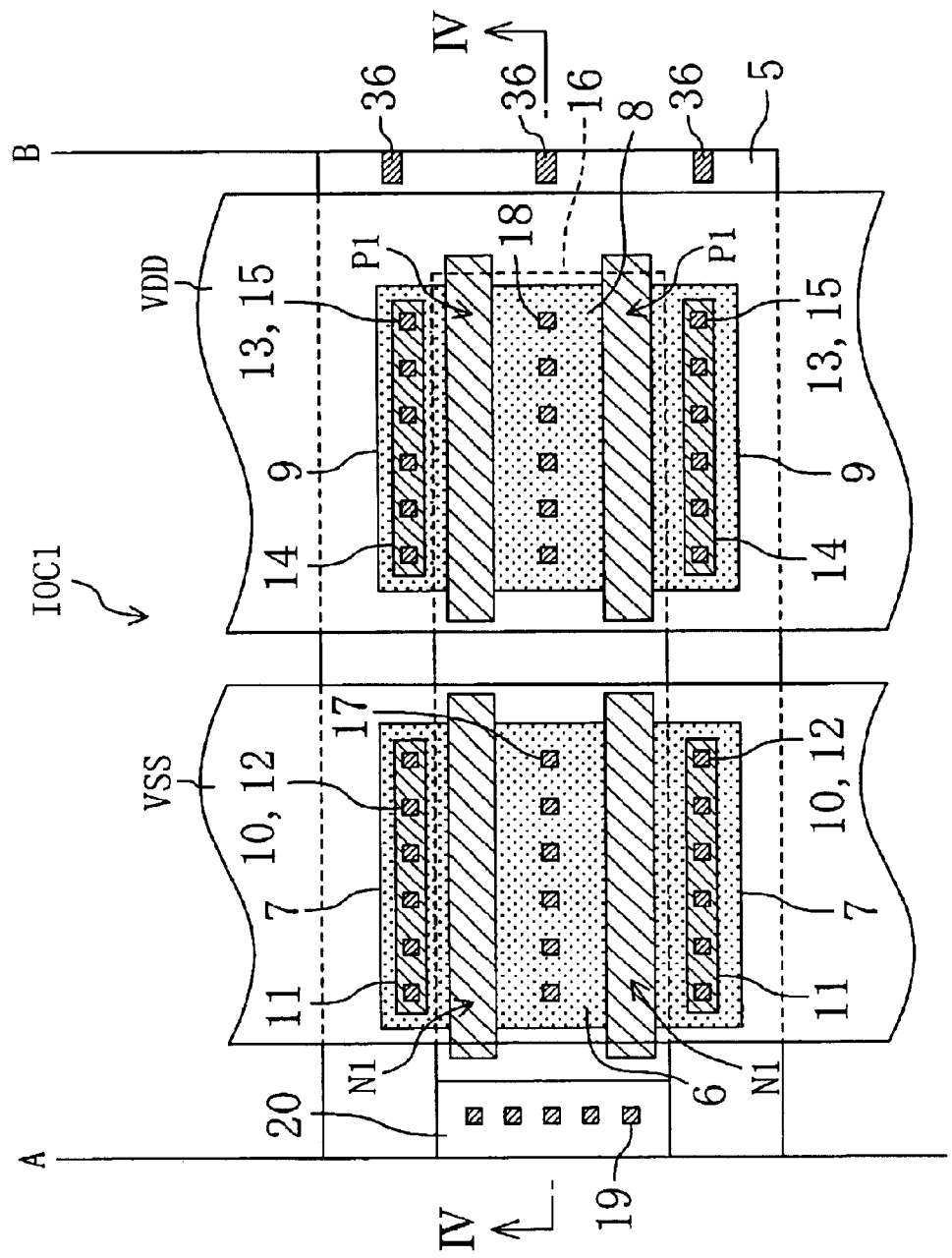
FIG. 3A is diagram showing a transverse cross-sectional view up to the second wiring layer of an input/output cell making up the input/output circuit portion of FIG. 1B.
Figure 3B:
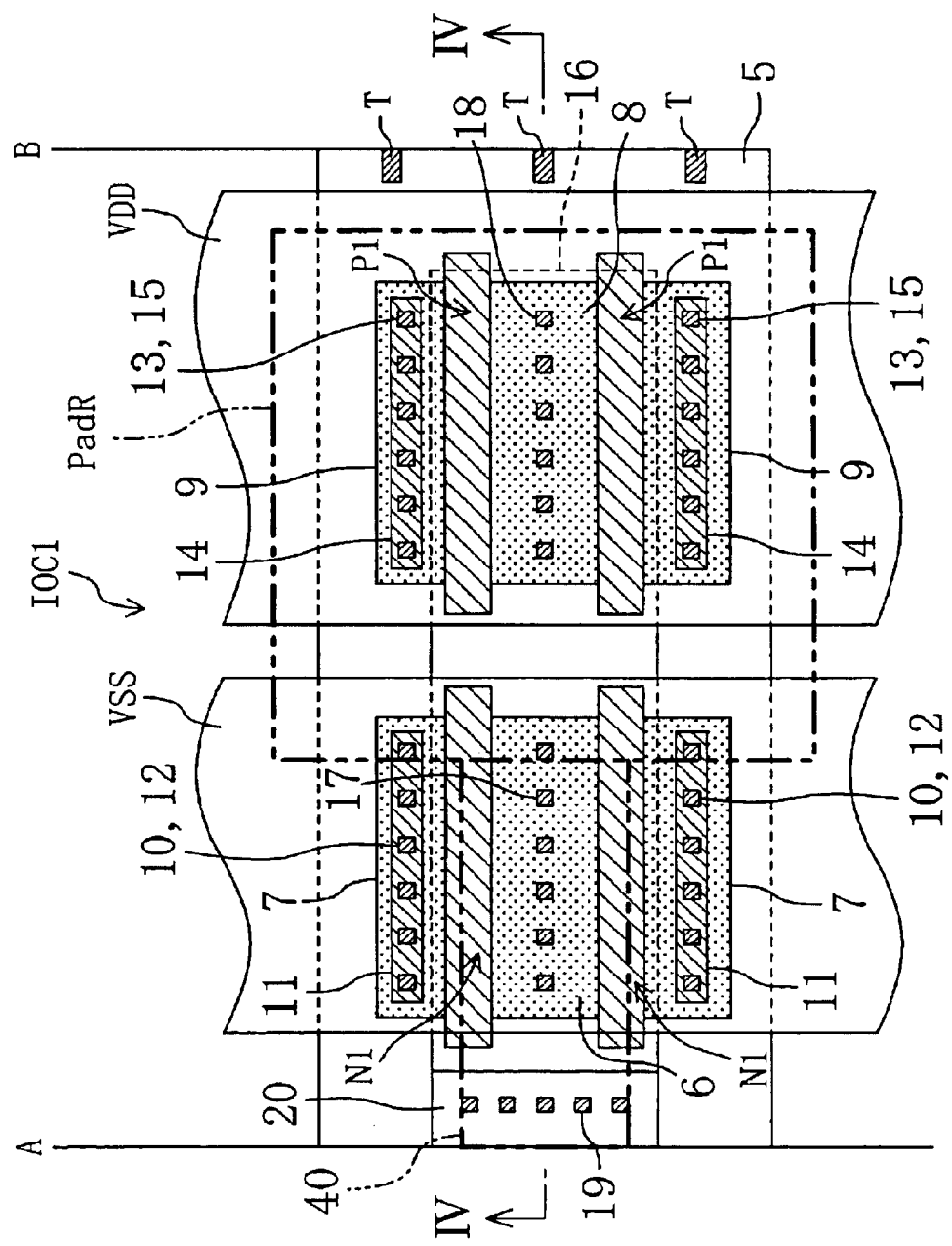
FIG. 3B is diagram showing a transverse cross-sectional view up to the third wiring layer of an input/output cell making up the input/output circuit portion of FIG. 1B.

The internal configurations of the input/output cells IOC1 to IOC4 are identical. Hereinafter, the specific layout of one of the input/output cells, IOC1, is described with reference to FIGS. 3A, 3B, and 4. FIGS. 3A and 3B are transverse sectional views and FIG. 4 is a cross-sectional view taken along the line IV—IV in FIG. 3B.

Figure 4:
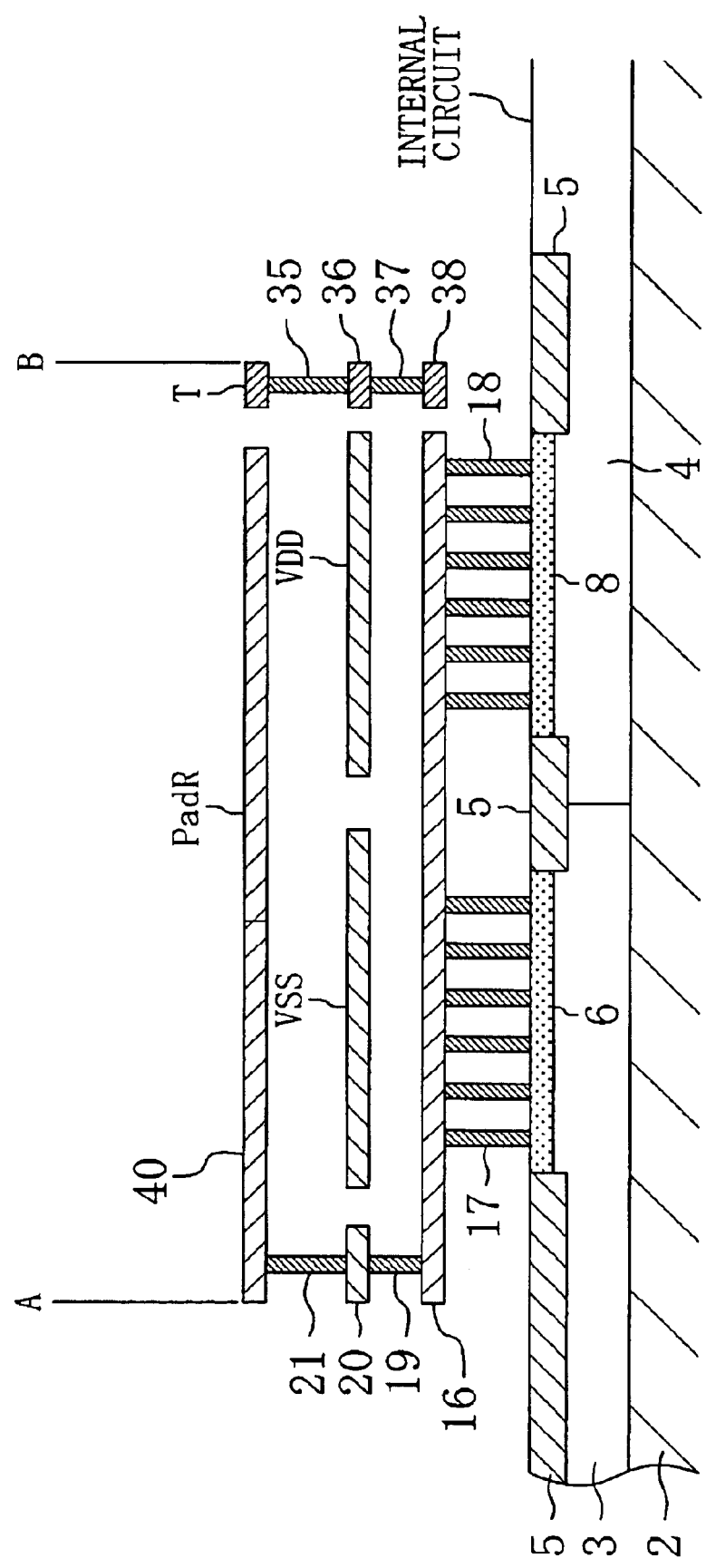
FIG. 4 is a cross-sectional view taken along the line IV—IV in FIG. 3B.

FIGS. 3B and 4 show an example in which the input/output cell IOC1 has three layers of wiring. It should be noted that FIGS. 3A, 3B, and 4 do not show the gate insulating film and the interlayer insulating films that insulate the wiring layers, and moreover, in FIG. 3A the third wiring layer is not shown. The reference number 2 denotes a p-type semiconductor substrate and 3 and 4 denote a p-type well and an n-type well, respectively, formed on the semiconductor substrate 2. N1 is an NMOS transistor divided into two segments on the p-type well 3, and P1 is a PMOS transistor divided into two segments on the n-type well 4. The transistors N1 and P1 make up output transistors, and are separated from one another by an element separation region 5. The reference numerals 6 and 7 denote n-type diffusion regions constituting the drain and the source, respectively, of the NMOS transistor N1, and 8 and 9 denote p-type diffusion regions constituting the drain and the source, respectively, of the PMOS transistor P1.

Also, VSS is power source wiring of the ground potential provided in the second wiring layer, and VDD is power source wiring of a predetermined potential provided in the second wiring layer. The power source wiring VSS is connected to the n-type diffusion region 7, which is the source of the NMOS transistor N1, via connection apertures 10, an isolated wiring region 11 provided in the first wiring layer, and connection apertures 12 (in FIGS. 3A and 3B, the two connection apertures 10 and 12 overlap one another because they are above and below one another). Also, the power source wiring VDD is connected to the p-type diffusion region 9, which is the source of the PMOS transistor P1, via connection apertures 13, an isolated wiring region 14 provided in the first wiring layer, and connection apertures 15 (in FIGS. 3A and 3B, the two connection apertures 13 and 15 overlap one another because they are above and below one another).

The reference numeral 40 denotes metallic wiring that is provided in the third wiring layer and that is connected to the electrode pads Pad. 16 is also metallic wiring provided in the first wiring layer, and through the metallic wiring 16 and 40 the output transistors N1 and P1 are connected to the electrode pads Pad. That is, the metallic wiring 16 is connected to the n-type diffusion region 6, which is the drain of the NMOS transistor N1, via connection apertures 17, and is connected to the p-type diffusion region 8, which is the drain of the PMOS transistor P1, via connection apertures 18. Moreover, the metallic wiring 16 is connected to the metallic wiring 40 via connection apertures 19, an isolated wiring region 20 provided in the second wiring layer, and connection apertures 21, connecting the metallic wiring 40 to the electrode pad Pad (in FIGS. 3A and 3B, the two connection apertures 19 and 21 are overlapping because the are above and below one another).

Also, as shown in FIG. 1A, the each of the plurality of input/output cells IOC1 to IOC4 have a plurality of internal terminals T at their end portion on the side adjacent to the internal circuit 30. The internal terminals T are disposed in the third wiring layer as shown in FIG. 4. The internal terminals T, as shown in FIG. 4, are connected to an isolated wiring region 36 provided in the second wring layer via connection apertures 35, and are also connected to an isolated wiring region 38 provided in the first wiring layer via connection apertures 37. Although not shown, the gate of the p-type MOS transistor P1 or the n-type MOS transistor N1 of the output transistor OT shown in FIG. 2 are controlled by a signal from the isolated wiring region 38 provided in the first wiring layer. On the other hand, although not shown, the internal terminals T are connected to the internal circuit 30. Consequently, signals from the internal circuit 30 are output to outside the semiconductor chip from the electrode pads Pad via the plurality of output transistors OT.

In FIG. 1A, the electrode pads PadL and PadR are shown disposed above the input/output cells IOC1 to IOC4. The electrode pads PadL and PadR have rectangular shapes, and the width Dp of the electrode pads PadL and PadR is wider than the width Di of the input/output cells IOC1 to IOC4. That is, because the external connection wiring (not shown) for transmitting signals to the outside is bonded, the width and the breadth of the electrode pads PadL and PadR are set to widths and breadths at which good bonding can be performed. On the other hand, the input/output cells IOC1 to IOC4 are set to a narrow width in order to increase the terminal pin number of the input/output circuit portion of the semiconductor chip (or in other words, the number of the electrode pads Pad) so as to narrow the pitch. Furthermore, the input/output cells IOC1 to IOC4 are disposed contacting one another without gaps between adjacent input/output cells, and many input/output cells are arranged within a predetermined distance so as to increase the terminal pin number even further.

Thus, because the width Dp of the electrode pads Pad is greater than the width Di of the input/output cells IOC1 to IOC4, both side portions of each electrode pad PadL and PadR protrude in the width direction from their input/output cell and extend inward in the width direction of neighboring input/output cells. For this reason, the electrode pads PadL and PadR cannot be arranged in a single line and are instead arranged staggered in two lines as shown in FIG. 1A, with electrodes pad PadL, which are disposed in the left row, adjacent to one another and electrodes pad PadR, which are disposed in the right row, adjacent to one another. Each electrode pad PadL and PadR is arranged at least a set distance away from other electrode pads positioned around it. More specifically, any two electrode pads PadL arranged in the same row and the electrode pads PadR arranged in the same row are positioned away from one another by a set distance Dr1, and the electrode pads PadL and PadR in respective left and right rows are positioned away from one another by a set distance Dr2. Both the set distances Dr1 and Dr2 are distances that fulfill the isolation rules of the layout design for the electrode pads PadL and PadR, and are at least the distances established by these isolation rules.

The two rows of electrode pads PadL and PadR are arranged in the uppermost layer (third layer), and the internal terminals T of the input/output cells IOC1 to IOC4 are also arranged in the uppermost layer. For this reason, as shown in FIG. 4, of the two rows of electrode pads PadL and PadR, the electrode pads PadR, which are in the row nearest the interior circuit 30 (the row on the right in FIG. 1A), are arranged away from the internal terminals T and toward the inside of the input/output cells so that they do not overlap with the internal terminals T of their respective input/output cells.

On the other hand, the electrode pads PadL of the other row (the row on the left in FIG. 1A), which are away from the internal terminals T, are positioned with their end portions above the input/output cells at locations removed from the electrode pads PadR, which are in the row close to the internal terminals T, by the set distance Dr2. Also, in this position they are connected to the metallic wiring 16 arranged in the first layer via the connection apertures 21, the isolated wiring layer 20 arranged in the second layer, and the connection apertures 19. Moreover, the metallic wiring 16 is connected to the n-type diffusion region 6, which is the drain of the n-type MOS transistor N1, via the connection apertures 17 and is connected to the p-type diffusion region 8, which is the drain of the p-type MOS transistor P1, via the connection apertures 18. The input/output cells IOC1 and IOC3, in which the electrode pads Pad of the right row are near the internal terminals T, are connected to the wiring 40, which extends to the left in FIG. 1A from the electrode pads PadR, in order to connect the electrode pads PadR to the drains of the n-type and p-type MOS transistors N1 and P1 because the power source wiring VDD and the ground wiring VSS are located below the electrode pads PadR, and the left end portions of the wiring 40 are connected, with the same configuration as the electrode pads PadL of the left row, to the drains of the n-type and p-type MOS transistors N1 and P1 via the metallic wiring 16 of the first layer and the connection apertures 17 and 18.

In this embodiment the electrode pads PadL and PadR are arranged above their respective input/output cells, and thus compared to a case in which the electrode pads PadL and PadR are arranged to the side of their respective input/output cells, the area of the input/output circuit portion is significantly reduced.

Moreover, the electrode pads PadR of the right row are arranged near the internal terminals T of the input/output cells IOC1 and IOC3. Consequently, compared to a case in which the electrode pads PadR of the right row are arranged in a center portion in the left to right direction of the input/output cells IOC1 and IOC3, for example, an even wider area of the electrode pads PadL of the left row are located above their respective input/output terminals IOC2 and IOC4, and the total area of the plurality of input/output cells IOC1 to IOC4 and the plurality of electrode pads PadL and PadR corresponding to the plurality of input/output cells IOC1 to IOC4 can be effectively reduced.

Moreover, even if the width of the each of the electrode pads PadL and PadR is greater than the width of the each of input/output cells IOC1 to IOC4 and the plurality of electrode pads PadL and PadR cannot be arranged in a single row, the electrode pads PadL and PadR are arranged staggered in two rows and the spacing between the electrode pads PadL and PadR is equal to or greater than the set distances Dr1 and Dr2, and thus the isolation rules of design for the area between electrode pads can be followed and the interference of signals between the electrode pads can be effectively prevented.

Figure 1B:
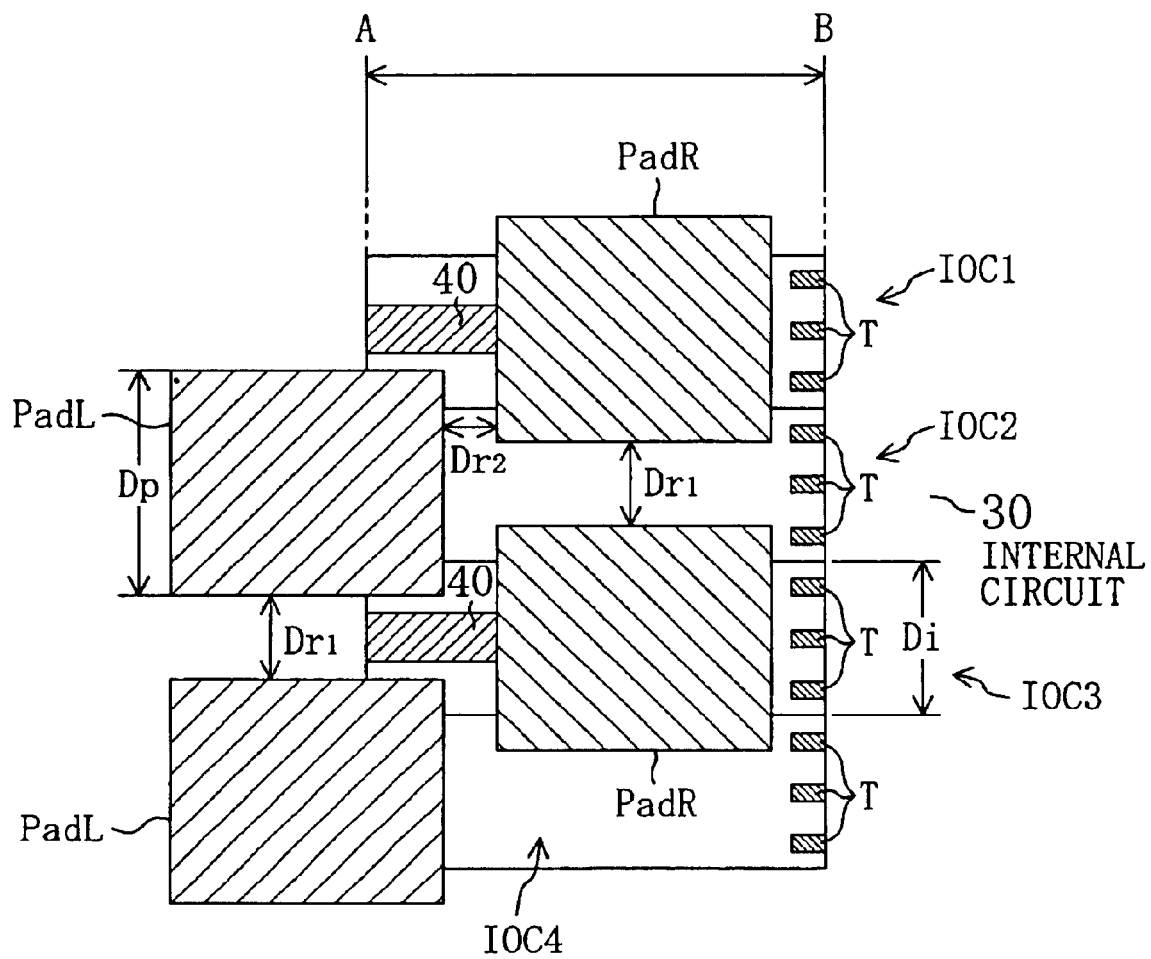
FIG. 1B is a plan view showing a portion of an input/output circuit portion, which is a semiconductor device, according to the first embodiment of the invention

Also, by arranging the electrode pads PadR of the right row close to the internal terminals T of the input/output cells IOC1 and IOC3, the PadLs and PadRs can be made long rectangular within a range that allows the isolation rules to be met, as shown in FIG. 1B.

In this case, when the electrode pads PadL and PadR are formed in long rectangular shapes, the probe contact position of the probe pins of the testing device and the bonding positions of the wires for connecting to the outside can be shifted within the same electrode pads PadL and PadR, allowing probing and bonding to be carried out at different locations. Consequently, contact marks from the probe pins are not left in the bonding positions, allowing the bonding of the wiring for connecting to the outside to be carried out favorably and bonding failures to be prevented.

Second Embodiment

A semiconductor device according to a second embodiment of the invention is described next.

Figure 5:
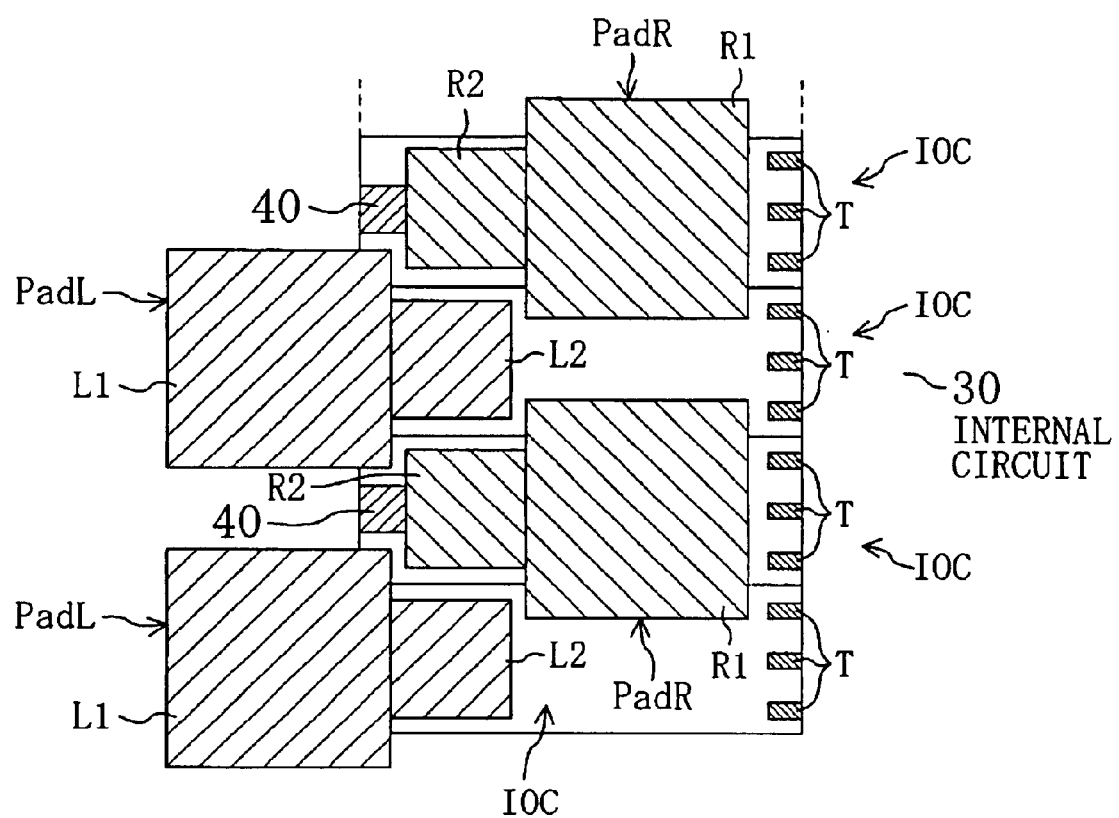
FIG. 5 is a plan view showing a portion of an input/output circuit portion, which is a semiconductor device, according to the second embodiment of the invention.
Figure 6:
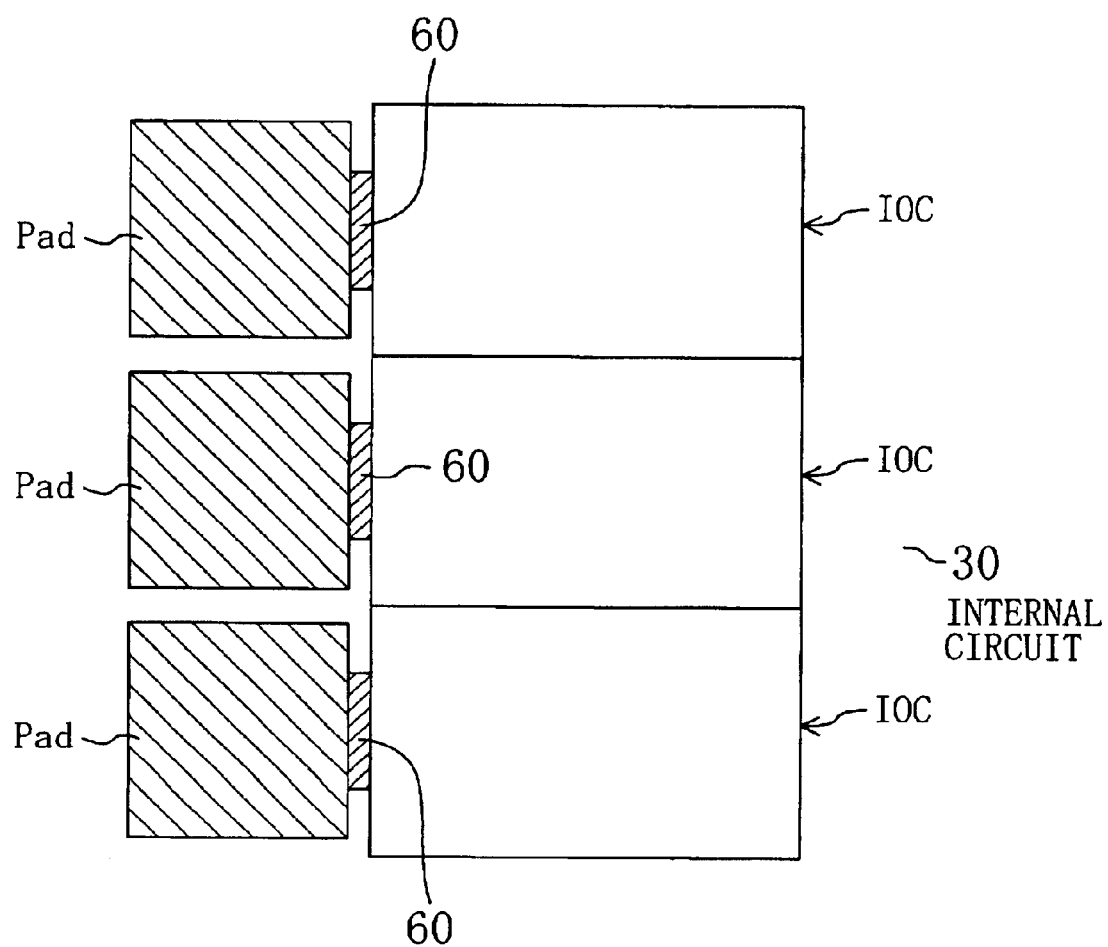
FIG. 6 is a plan view showing the configuration of a portion of a conventional input/output circuit portion, which is a semiconductor device.
Figure 7:
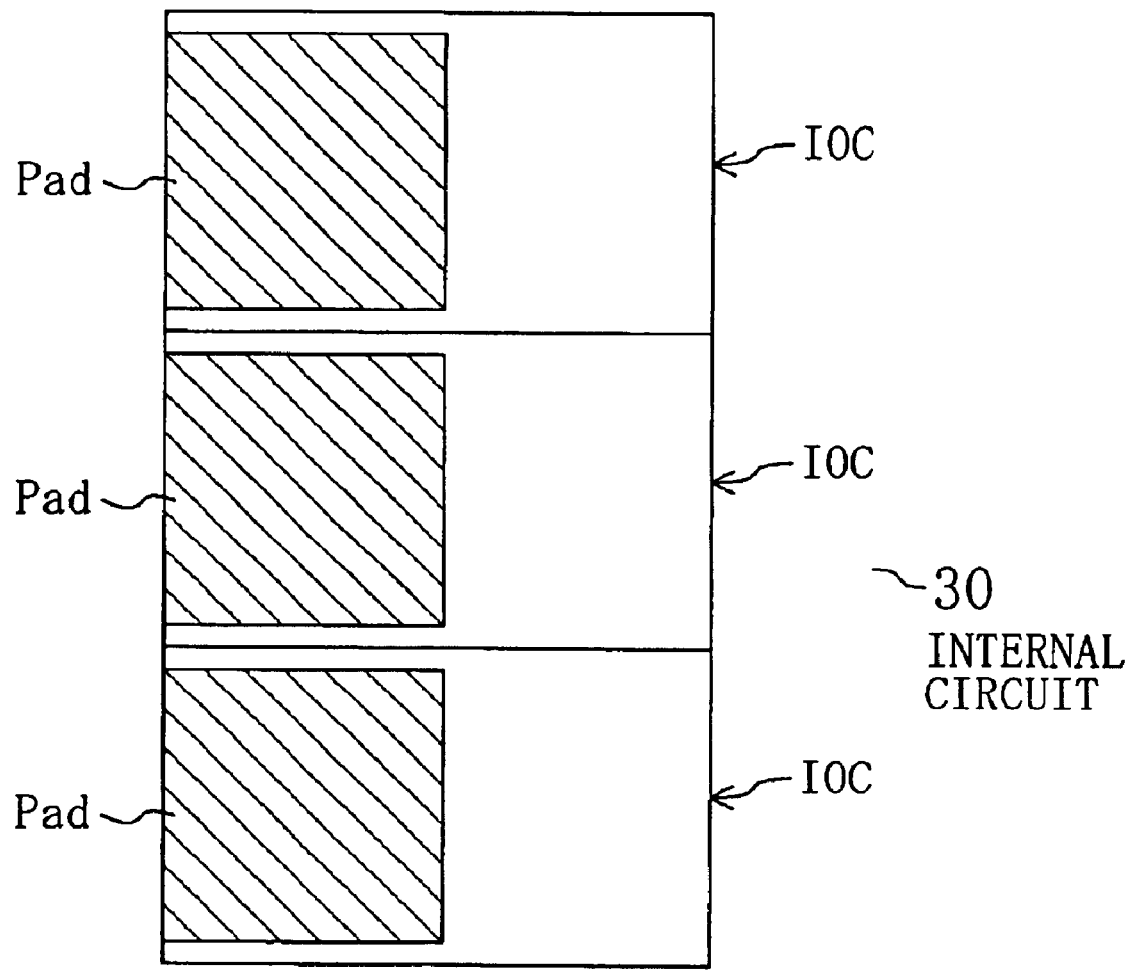
FIG. 7 is a plan view showing another configuration of a portion of a conventional input/output circuit portion, which is a semiconductor device.
Figure 8:
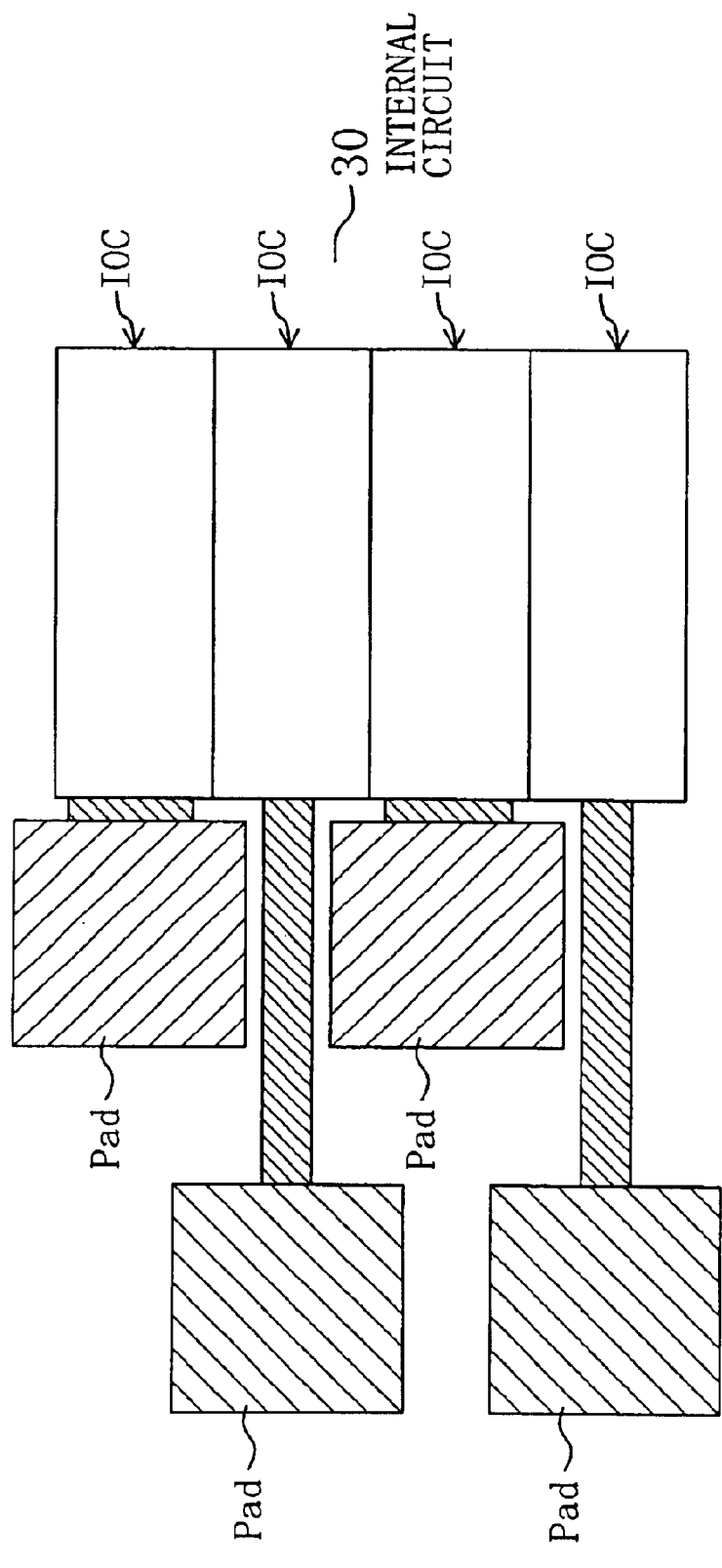
FIG. 8 is a plan view showing yet another configuration of a portion of a conventional input/output circuit portion, which is a semiconductor device.

FIG. 5 schematically shows the configuration of an input/output circuit portion, which is the semiconductor device of this embodiment. In FIG. 5, the electrode pads PadL and PadR of the rows are shaped differently than the square shape shown in FIG. 1A, and are formed in a step-like manner having first and second pad portions L1, L2, R1, and R2 with different widths. Other aspects of the configuration are the same as those of the semiconductor device of FIG. 1A, and thus a description thereof is omitted.

The electrode pads PadL and PadR are disposed in a shape in which their left and right are reversed. With respect to the electrode pads PadL and PadR, the first pad portions L1 and R1, which have a large width, are bonding electrode regions to which wiring for connecting to the outside is bonded, and the second pad portions L2 and R2, which have narrow widths, are testing electrode regions to which probe pins come into contact with during testing of the internal circuit 30.

In this embodiment, first pad portions (bonding electrode regions) L1 and R1 and testing electrode regions (second pad portions L2 and R2) are formed in the electrode pads PadL and PadR so that contact with the probe pins and bonding are carried out in different locations, and thus no contact marks are left in the first pad portions (the bonding electrode regions) L1 and R1 by the probe pins of the testing device, the bonding of the wiring for connecting to the outside can be carried out favorably, and bonding failure can be prevented.

It should be noted that in this embodiment an example was shown in which the electrode pads were constituted by two pad portions with different widths, although the electrode pads may also have three electrode pads of different widths.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:

a plurality of cells having output transistors formed on a substrate; and a plurality of electrode pads connected to output transistors of corresponding cells for outputting an output of said output transistors to the outside, wherein the electrode pads are positioned above corresponding cells in the thickness direction of the substrate and arranged in a staggered fashion, distanced from the electrode pads of adjacent cells by at least a set distance.

2. The semiconductor device according to claim 1, wherein the cells have internal terminals for transmitting signals of the output transistors to the outside in an end portion in their length direction, and wherein the electrode pads are disposed in locations where the electrode pads do not overlap in the thickness direction of the substrate with the internal terminals of corresponding cells.

3. The semiconductor device according to claim 2, wherein every other electrode pad is lined up near the internal terminals of a corresponding cell.

4. The semiconductor device according to claim 1, wherein the plurality of cells are arranged without gaps between them and adjacent cells.

5. The semiconductor device according to claim 1, wherein the electrode pads have a rectangular shape respectively.

6. The semiconductor device according to claim 1, wherein the electrode pads have at least first and second pad portions with different widths and the first and second pad portions as a whole are formed in a step-like fashion.

7. The semiconductor device according to claim 6, wherein the first pad portion has a wide width and is bonded to wiring for connecting to the outside for outputting an output of the output transistors to the outside, and the second pad portion has a narrow width and serves as a test portion to which probe pins for testing come into contact with.

8. The semiconductor device according to claim 1, wherein the electrode pads are wider than corresponding cells and extend in the width direction toward the inside of cells adjacent the corresponding cells.

9. The semiconductor device according to claim 1, wherein power source wiring or ground wiring supplying power source voltage or ground voltage to the output transistors is arranged below the electrode pads in the thickness direction of the substrate.

10. The semiconductor device according to claim 1, wherein the plurality of electrode pads cover at least a portion of corresponding cells in the thickness direction of the substrate.

11. The semiconductor device according to claim 1, wherein the plurality of cells are arranged in a line.

12. The semiconductor device according to claim 1, wherein the plurality of electrode pads are arranged in a staggered fashion relative to adjacent electrode pads.

* * * * *